US011949418B2

United States Patent
Fujimoto (10) Patent No.: US 11,949,418 B2
(45) Date of Patent: Apr. 2, 2024

(54) COMPARATOR CIRCUIT AND AD CONVERTER

(71) Applicant: Rohm Co., Ltd., Kyoto (JP)

(72) Inventor: Yoshiaki Fujimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 133 days.

(21) Appl. No.: 17/778,116

(22) PCT Filed: Nov. 10, 2020

(86) PCT No.: PCT/JP2020/041842
§ 371 (c)(1),
(2) Date: May 19, 2022

(87) PCT Pub. No.: WO2021/106544
PCT Pub. Date: Jun. 3, 2021

(65) Prior Publication Data
US 2022/0416772 A1 Dec. 29, 2022

(30) Foreign Application Priority Data
Nov. 28, 2019 (JP) .................. 2019-215020

(51) Int. Cl.
*H03K 5/08* (2006.01)
*H03M 1/38* (2006.01)

(52) U.S. Cl.
CPC ............ *H03K 5/08* (2013.01); *H03M 1/38* (2013.01)

(58) Field of Classification Search
CPC .......... H03M 1/38; H03M 1/46; H03M 1/462; H03K 5/08; H03K 5/249
See application file for complete search history.

(56) References Cited

U.S. PATENT DOCUMENTS

RE31,658 E * 9/1984 Rachel ............... F02D 41/3005
327/261
6,118,678 A * 9/2000 Limpaecher ........ H02M 5/4505
363/60
(Continued)

FOREIGN PATENT DOCUMENTS

JP H06-038573 5/1994
JP H10-145196 5/1998
(Continued)

OTHER PUBLICATIONS

International Search Report in International Appln. No. PCT/JP2020/041842, dated Feb. 9, 2021, 5 pages (with English Translation).

*Primary Examiner* — Lam T Mai
(74) *Attorney, Agent, or Firm* — Fish & Richardson P.C.

(57) ABSTRACT

A comparator circuit includes a zeroth capacitor having a first terminal fed with an input voltage, a zeroth inverter having an input terminal connected to a second terminal of the zeroth capacitor at a zeroth node, a first capacitor having a first terminal connected to the output terminal of the zeroth inverter at a first node, a first inverter having an input terminal connected to a second terminal of the first capacitor at a second node, a second inverter having an input terminal connected to the output terminal of the first inverter at a third node, a zeroth switch switching conduction between the zeroth and first nodes, a first switch switching conduction between the second and third nodes, a second switch switching conduction between the first and third nodes, and a third switch switching conduction between the third node and the output terminal of the second inverter.

8 Claims, 9 Drawing Sheets

(56) References Cited

U.S. PATENT DOCUMENTS

| | | | | |
|---|---|---|---|---|
| 10,211,844 B1* | 2/2019 | Molev-Shteiman | .. | H03M 1/002 |
| 2005/0099329 A1* | 5/2005 | Kawata | ................ | H03M 1/46 |
| | | | | 341/158 |
| 2007/0279103 A1* | 12/2007 | Sugai | .................... | H03K 5/249 |
| | | | | 327/85 |
| 2010/0245149 A1* | 9/2010 | Danjo | ................... | H03K 5/249 |
| | | | | 341/155 |
| 2013/0148438 A1* | 6/2013 | Chen | ...................... | G11C 7/12 |
| | | | | 365/191 |

FOREIGN PATENT DOCUMENTS

| JP | 2007-329518 | 12/2007 |
|---|---|---|
| JP | 2016-220172 | 12/2016 |

\* cited by examiner

COMPARATOR CIRCUIT AND AD CONVERTER

TECHNICAL FIELD

The present invention relates to a comparator circuit and an AD converter.

BACKGROUND ART

Conventionally, ADCs (AD converters) that convert an analog signal to a digital signal are applied in various systems. As one kind of ADC, successive approximation ADCs are known (for example as disclosed in Patent Document 1).

A successive approximation ADC includes a comparator and a DAC (DAC converter) and, through comparison of an analog input signal and a DAC output by the comparator, converts the analog input signal to a digital output signal.

LIST OF CITATIONS

Patent Literature

Japanese Patent Application published as No. 2016-220172.

SUMMARY OF THE INVENTION

Problem to be Solved by the Invention

Here, a comparator includes an inverter. The threshold voltage of the inverter may contain an offset. The offset may cause an indefinite comparison judgment output from the inverter.

Against the background described above, the present invention is aimed at providing a comparator circuit that can prevent an indefinite comparison judgment output.

Means for Solving the Problem

According to one aspect of the present invention, a comparator circuit includes a zeroth capacitor configured to have a first terminal to which an input voltage is applied, a zeroth inverter configured to have an input terminal connected to a second terminal of the zeroth capacitor at a zeroth node, a first capacitor configured to have a first terminal connected to the output terminal of the zeroth inverter at a first node, a first inverter configured to have an input terminal connected to a second terminal of the first capacitor at a second node, a second inverter configured to have an input terminal connected to the output terminal of the first inverter at a third node, a zeroth switch configured to switch between conducting and cut-off states the path between the zeroth and first nodes, a first switch configured to switch between conducting and cut-off states the path between the second and third nodes, a second switch configured to switch between conducting and cut-off states the path between the first and third nodes, and a third switch configured to switch between conducting and cut-off states the path between the third node and the output terminal of the second inverter (a first configuration).

In the first configuration described above, preferably, there is further provided a third inverter configured to have an input terminal connected to the output terminal of the second inverter at a fourth node (a second configuration).

In the first or second configuration described above, preferably, the zeroth to second inverters are configured to each include a PMOS transistor configured to have the source to which a supply voltage is applied and an NMOS transistor configured to have the drain connected to the drain of the PMOS transistor and the source to which a ground potential is applied. The gate of the PMOS transistor and the gate of the NMOS transistor may be configured to be short-circuited together (a third configuration).

In the third configuration described above, preferably, there is further provided a power supply switch configured to switch between conducting and cut-off states a path between an application terminal for the supply voltage and the source of the PMOS transistor (a fourth configuration).

In the fourth configuration described above, preferably, with the power supply switch off, an equal potential is applied to the gate and the back gate of the PMOS transistor included in at least one of the first and second inverters (a fifth configuration).

In the fifth configuration described above, preferably, there is further provided a switch configured to switch between conducting and cut-off states the path between the back gate and an application terminal for the ground potential (a sixth configuration).

In the fifth configuration described above, preferably, at least one of the third and second nodes is pulled up with the PMOS transistor (a seventh configuration).

According to another aspect of the present invention, preferably, an AD converter includes the comparator circuit according to any one of the configurations described above, a DAC data generator configured to generate DAC data, which is digital data, a DAC (DA converter), and an output signal generator. The comparator circuit may be configured to sample an input signal, which is an analog signal, and compare the sampled input signal with analog data that results from the DAC converting the DAC data. The DAC data generator may be configured to update the DAC data in accordance with the result of comparison by the comparator circuit. The output signal generator may be configured to determine the bit data of an output signal in accordance with the result of comparison by the comparator circuit.

Advantageous Effects of the Invention

With a comparator circuit according to the present invention, it is possible to prevent an indefinite comparison judgment output.

DESCRIPTION OF EMBODIMENTS

Exemplary embodiments of the present invention will be described below with reference to the accompanying drawings.

Configuration of an ADC

Figure 1:
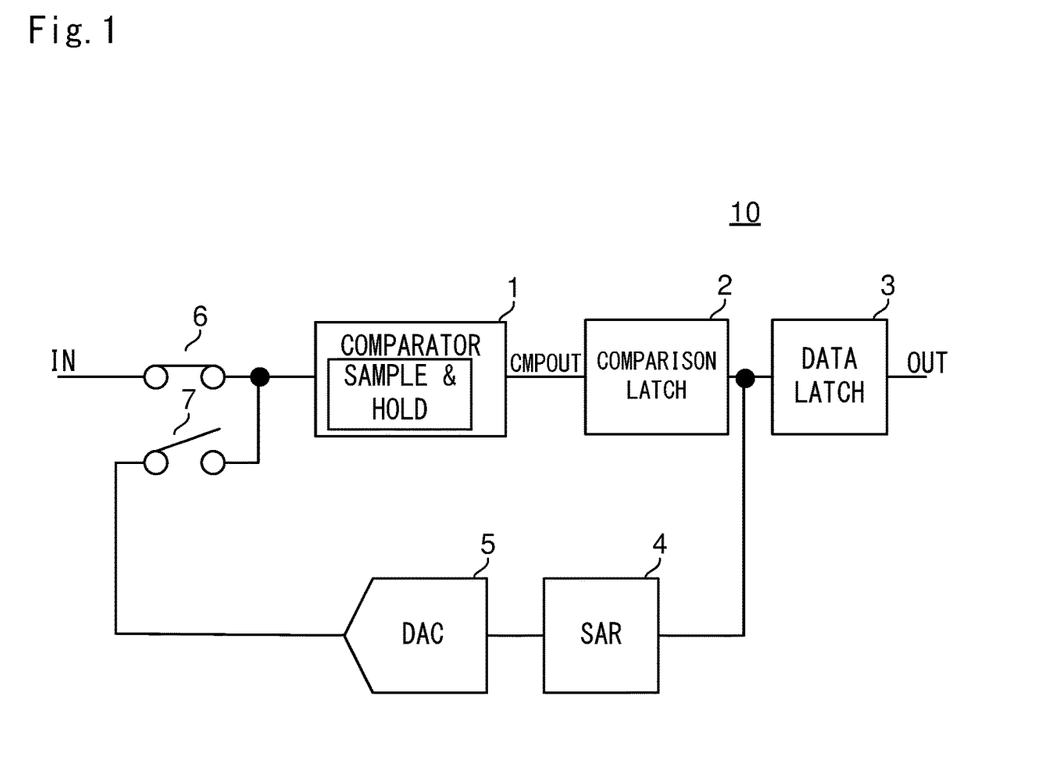
FIG. 1 is a diagram showing a configuration of an AD converter according to one embodiment of the present invention.

FIG. 1 is a block diagram showing a configuration of an ADC (AD converter) 10 according to one embodiment of the present invention. The ADC 10 converts an input signal IN, which is an analog signal, to an output signal OUT, which is a digital signal, and outputs the result. The ADC 10 performs what is called successive approximation AD conversion.

An AD converter 10 includes a comparator 1, a comparison latch 2, a data latch 3, a DAC data generator 4, a DAC (DA converter) 5, a switch 6, and a switch 7.

The comparator 1 compares the input signal IN with analog data output from the DAC 5 and outputs a comparison judgment output CMPOUT as a comparison result. More specifically, the comparator 1 samples the input signal IN and compares it with the analog data.

The comparison latch 2 holds the comparison judgment output CMPOUT output from the comparator 1. That is, the comparison latch 2 holds a High or Low one-bit signal.

The data latch (output signal generator) 3 holds High or Low data for each bit in accordance with the data held by the comparison latch 2 and holds data of a predetermined number of bits (for example, 12 bits). The data of the predetermined number of bits held by the data latch 3 is output as the output signal OUT.

The DAC data generator 4 is configured as a successive approximation register (SAR) and generates DAC data, which is digital data, in accordance with the data held by the comparison latch 2. The DAC data is converted to analog data by the DAC 5.

The switch 6 switches between conducting and cut-off states the input path of the input signal IN to the comparator 1. The switch 7 switches between conducting and cut-off states the input path of the analog data output from the DAC 5 to the comparator 1.

Successive Approximation AD Conversion

A description will be given of successive approximation AD converting operation for converting the input signal IN to the output signal OUT in the ADC 10. Successive approximation type AD converting operation includes sampling operation and comparison operation. Here, as one example, it is assumed that the ADC 10 performs 12-bit AD conversion.

First, with the switch 6 on and the switch 7 off, the input signal IN is fed to the comparator 1 and the sampling of the input signal IN is performed by the comparator 1. After that, with the switch 6 off and the switch 7 on, the comparison operation is started.

In comparison operation, as the initial value, the MSB (most significant bit) of the 12-bit digital value in the DAC data generator 4 is set at "1" and the other bits are set at "0". That is, the initial value is set at the mid value (2048) of the 12-bit dynamic range (0 to 4095). Then, the digital value in the DAC data generator 4 is DA converted to analog data by the DAC 5. The analog data is fed to the comparator 1 via the switch 7.

The comparator 1 compares the input signal IN with the analog data and outputs the comparison judgment output CMPOUT.

If the level of the comparison judgment output CMPOUT held by the comparison latch 2 indicates that the input signal IN>the analog data (DAC output voltage), it is determined that, of the 12-bit digital value in the data latch 3, MSB="1". In this case, the MSB of the 12-bit digital value in the DAC data generator 4 is set at "1", the second MSB is set at "1", and the other bits are set at "0". That is, the digital value is set at the mid value (3072) of the upper half of the 12-bit dynamic range. Then, the digital value in the DAC data generator 4 is converted by the DAC 5 to analog data, which is fed to the comparator 1.

On the other hand, if the level of the comparison signal CMPOUT held by the comparison latch 2 indicates that the input signal IN<the analog data, it is determined that, of the 12-bit digital value in the data latch 3, MSB="0". In this case, the MSB of the 12-bit digital value in the DAC data generator 4 is set at "0", the second MSB is set at "1", and the other bits are set at "0". That is, the digital value is set at the mid value (1024) of the lower half of the 12-bit dynamic range. Then, the digital value in the DAC data generator 4 is converted by the DAC 5 to analog data, which is fed to the comparator 1.

From then on, likewise, the bits of the digital value in the data latch 3 are sequentially determined in accordance with the result of comparison by the comparator 1, and the digital value set in the DAC data generator 4 is updated. When the bits of the digital value in the data latch 3 are determined down to the LSB (least significant bit), converting operation is complete, and the digital value in the data latch 3 is output as the output signal OUT.

First Comparative Example

Hereinafter, the comparator 1 provided in the ADC 10 described previously will be described in more detail. Here, prior to a description of embodiments of the present invention, first a comparator 1 according to a comparative example will be described.

Figure 2:
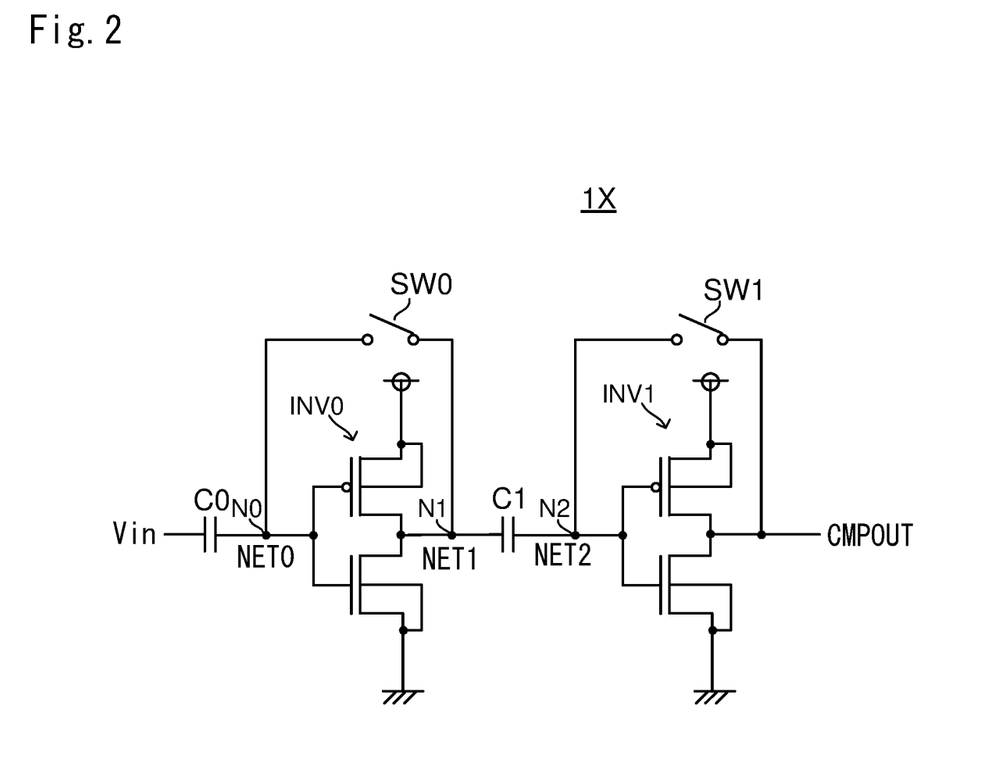
FIG. 2 is a diagram showing a configuration of a comparator according to a first comparative example.

FIG. 2 shows a configuration of a comparator 1X according to a first comparative example. The comparator 1X includes an inverter INV0 and an inverter INV1. The inverters INV0 and INV1 are each configured with a PMOS transistor and an NMOS transistor.

More specifically, to the source of the PMOS transistor, an application terminal for a supply voltage is connected, and to the drain of the PMOS transistor, the drain of the NMOS transistor is connected. The source of the NMOS transistor is connected to an application terminal for a ground potential. The gate of the PMOS transistor and the gate of the NMOS transistor are short-circuited together. The node at which the drain of the PMOS transistor and the drain of the NMOS transistor are connected together serves as the output terminal of the inverter, and the node at which the gate of the PMOS transistor and the gate of the NMOS transistor are connected together serves as the input terminal of the inverter. Any inverters in any other comparators described later have a similar configuration.

As shown in FIG. 2, the comparator 1X also includes capacitors C0 and C1. The first terminal of the capacitor C0 is fed with the input voltage Vin. The second terminal of the capacitor C0 and the input terminal of the inverter INV0 are connected together at a node N0. The output terminal of the inverter INV0 and the first terminal of the capacitor C1 are connected together at a node N1. The second terminal of the capacitor C1 and the input terminal of the inverter INV1 are connected together at a node N2. The comparison judgment output CMPOUT is output from the output terminal of the inverter INV1.

As shown in FIG. 2, the comparator 1X further includes switches SW0 and SW1. The switch SW0 switches between conducting and cut-off states the path between the nodes N0 and N1. The switch SW1 switches between conducting and cut-off states the path between the node N2 and the output terminal of the inverter INV1.

Figure 3:
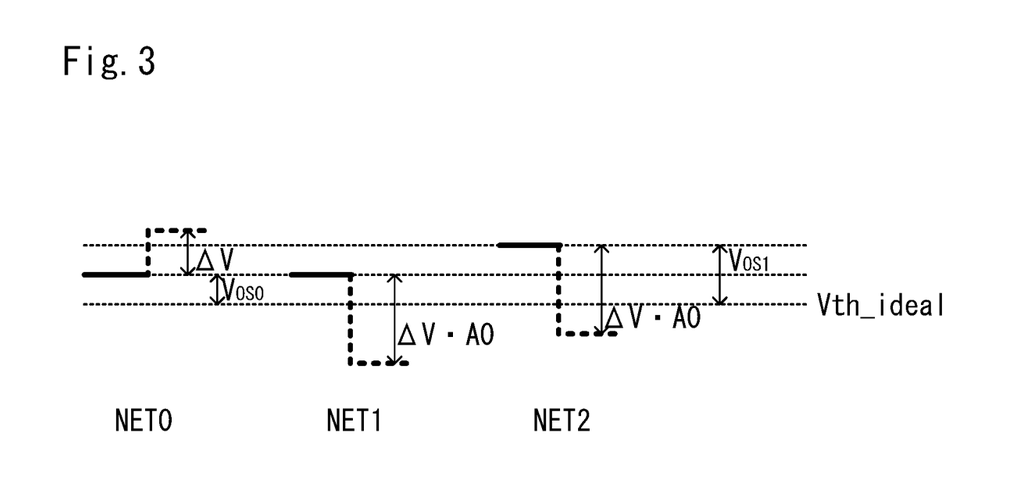
FIG. 3 is a diagram showing one example of the behavior of each node voltage in the comparator according to the first comparative example.

The operation of the comparator 1X so configured will be described with reference to FIG. 3. FIG. 3 shows the behavior of node voltages NET0 to NET2, which are the voltages at the nodes N0 to N2 respectively. In FIG. 3, solid lines indicate sampling operation and broken lines indicate comparison operation.

First, with the switches SW0 and SW1 on, sampling is performed. Here, with the nodes N0 and N1 short-circuited together, the node voltages NET0 and NET1 are both equal to the threshold voltage of the inverter INV0. Here, in the example in FIG. 3, the threshold voltage of the inverter INV0 contains an offset Vos0 from the ideal threshold voltage Vth_ideal. With the node N2 and the inverter INV1 short-circuited with each other, the node voltage NET2 is equal to the threshold voltage of the inverter INV1. Here, in the example in FIG. 3, the threshold voltage of the inverter INV1 contains an offset Vos1 from the ideal threshold voltage Vth_ideal.

During sampling, with the switch 6 in the ADC 10 (FIG. 1) on, the input signal IN is fed as the input voltage Vin to the first terminal of the capacitor C0. Thus, due to the potential difference between the input signal IN and the node voltage NET0, electric charge is stored in the capacitor C0. Due to the potential difference between the node voltages NET1 and NET2, electric charge is stored in the capacitor C1.

Next, with the switches SW0 and SW1 off, comparison operation is performed. Here, with the switch 7 in the ADC 10 on, the analog data (DAC output voltage) output from the DAC5 is fed as the input voltage Vin to the first terminal of the capacitor C0. The potential difference at the capacitor C0 is maintained with the electric charge in the capacitor C0, and thus a voltage change ΔV occurs in the node voltage NET0 as large as the difference between the input signal IN and the analog data. FIG. 3 shows an example of the voltage change ΔV observed when the analog data is higher than the input signal IN.

Here, as shown in FIG. 3, when it is assumed that the gain of the inverter INV0 is A0, the node voltage NET1 is a voltage deviated from the threshold voltage of the inverter INV0 by ΔV*A0 to the side opposite to the node voltage NET0. The electric charge stored in the capacitor C1 during sampling is maintained, and thus, as shown in FIG. 3, the node voltage NET2 is a voltage deviated from the threshold voltage of the inverter INV1 by ΔV*A0.

The gain of the inverter INV1 is infinite; thus, in the case shown in FIG. 3, the comparison judgment output CMPOUT, which is the output of the inverter INV1, is High.

With the comparator 1X according to the first comparative example described above, it is possible to make the offset of the comparator zero. Inconveniently, however, a large difference between the node voltage NET0, which is the input to the inverter INV0, and the threshold voltage of the inverter INV0 dampens the response of the node voltage NET1, which is the output of the inverter INV0. In the example in FIG. 3, when, in the comparison operation subsequent to that shown in FIG. 3, the node voltage NET0 is lower than the threshold voltage of the inverter INV0 and the difference between the node voltage NET0 and the threshold voltage is large, the node voltage NET1 needs to rise significantly from a voltage lower by ΔV*A0 than the threshold voltage to a voltage higher than the threshold voltage, and this causes slow response.

Second Comparative Example

Figure 4:
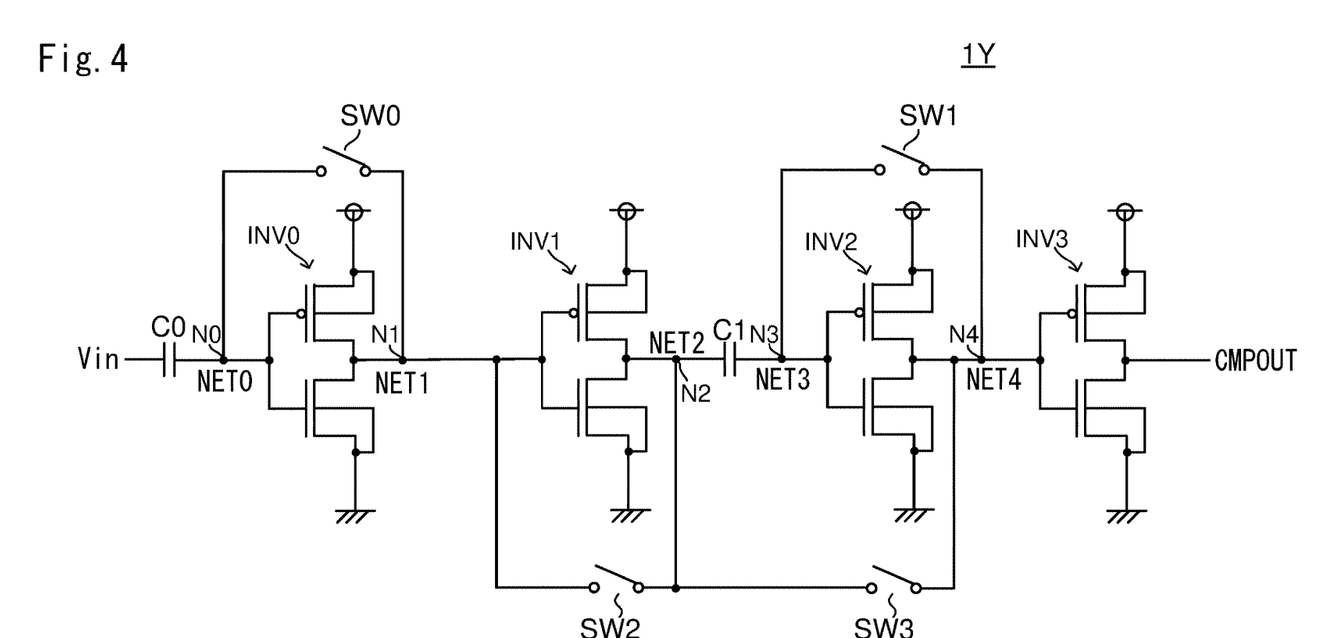
FIG. 4 is a diagram showing a configuration of a comparator according to a second comparative example.

Next, a description will be given of a comparator according to a second comparative example. The second comparative example is an improved version of the first comparative example described above, devised to solve the above problem. FIG. 4 shows a configuration of a comparator 1Y according to the second comparative example.

As shown in FIG. 4, the comparator 1Y includes inverters INV0 to INV3, capacitors C0 and C1, and switches SW0 to SW3.

The first terminal of the capacitor C0 is fed with the input voltage Vin. The second terminal of the capacitor C0 and the input terminal of the inverter INV0 are connected together at a node N0. The output terminal of the inverter INV0 and the input terminal of the inverter INV1 are connected together at a node N1. The output terminal of the inverter INV1 and the first terminal of the capacitor C1 are connected together at a node N2. The second terminal of the capacitor C1 and the input terminal of the inverter INV2 are connected together at a node N3. The output terminal of the inverter INV2 and the input terminal of the inverter INV3 are connected together at a node N4.

The switch SW0 switches between conducting and cut-off states the path between the nodes N0 and N1. The switch SW1 switches between conducting and cut-off states the path between the nodes N3 and N4. The switch SW2 switches between conducting and cut-off states the path between the nodes N1 and N2. The switch SW3 switches between conducting and cut-off states the path between the nodes N2 and N4.

Figure 6:
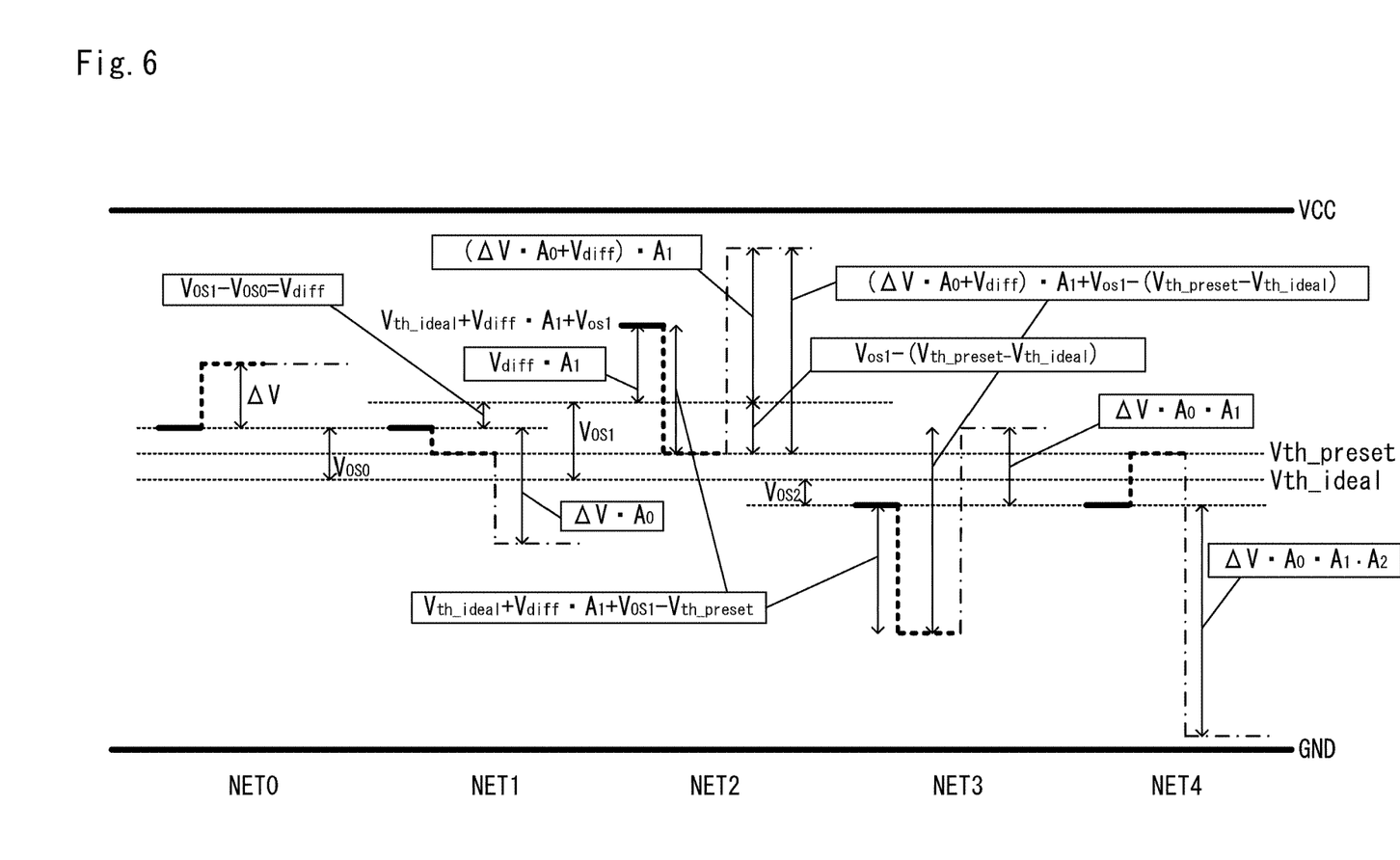
FIG. 6 is a diagram showing one example of the behavior of each node voltage in the comparator according to the second comparative example.

The operation of the comparator 1Y so configured will be described with reference to FIG. 6. FIG. 6 shows the behavior of the node voltages NET0 to NET4 at the nodes N0 to N4 respectively. In FIG. 6, solid lines indicate sampling, broken lines indicate presetting, and dash-dot lines indicate comparison operation.

Figure 5:
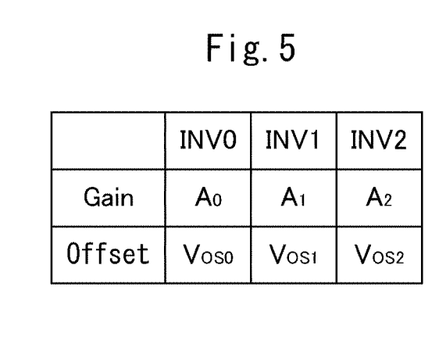
FIG. 5 is a diagram showing the characteristics of each inverter in the comparator according to the second comparative example.

As shown in FIG. 5, it is assumed that the gains of the inverters INV0 to INV2 are A0 to A2 respectively and the offsets in the threshold voltage of the inverters INV0 to INV2 are Vos0 to Vos2 respectively.

First, with the switches SW0 and SW1 on and the switches SW2 and SW3 off, sampling is performed. Here, with the nodes N0 and N1 short-circuited together, the node voltages NET0 and NET1 are both equal to the threshold voltage of the inverter INV0. Here, in the example in FIG. 6, the threshold voltage of the inverter INV0 contains an offset Vos0 (FIG. 5) from the ideal threshold voltage Vth_ideal. With the nodes N3 and N4 short-circuited together, the node voltages NET3 and NET4 are both equal to the threshold voltage of the inverter INV2. Here, in the example in FIG. 6, the threshold voltage of the inverter INV2 contains an offset Vos2 (FIG. 5) from the ideal threshold voltage Vth_ideal.

Here, the threshold voltage of the inverter INV1 contains an offset Vos1 (FIG. 5) from the ideal threshold voltage Vth_ideal. The difference between the node voltage NET1, which is the input to the inverter INV1, and the threshold voltage of the inverter INV1 equals Vdiff=Vos1−Vos0. Thus, the node voltage NET2, which is the output of the inverter INV1, equals Vth_ideal+Vdiff*A1+Vos1.

During sampling, the input signal IN is fed to the first terminal of the capacitor C0 as the input voltage Vin and, in accordance with the potential difference between the input voltage Vin and the node voltage NET0, electric charge is stored in the capacitor C0.

Next, with the switches SW0 and SW1 off and the switches SW2 and SW3 on, presetting is performed. Here, with the nodes N1, N2, and N4 short-circuited together, the node voltages NET1, NET2, and NET4 are all equal, at the preset voltage Vth_preset, which is the stabilization point.

The node voltage NET2 changes from Vth_ideal+Vdiff*A1+Vos1 during sampling to the preset voltage Vth_preset. In the capacitor C1, electric charge in accordance with the potential difference between the node voltages NET2 and NET3 during sampling is maintained; thus, during presetting, the node voltage NET3 is equal to a voltage changed from the threshold voltage of the inverter INV2 by Vth_ideal+Vdiff*A1+Vos1−Vth_preset.

During presetting, the analog data (DAC output voltage) output from the DAC5 is fed as the input voltage Vin to the first terminal of the capacitor C0. The potential difference at the capacitor C0 is maintained with the electric charge in the capacitor C0, and thus a voltage change ΔV occurs in the node voltage NET0 as large as the difference between the input signal IN and the analog data. FIG. 6 shows an example of the voltage change ΔV when the analog data is higher than the input signal IN.

Next, with the switches SW0 to SW3 all off, comparison operation is performed. Here, the node voltage NET1, which is the output of the inverter INV0, is equal to a voltage deviated from the threshold voltage of the inverter INV0 by ΔV*A0 in the direction opposite to the direction in which ΔV changes. The node voltage NET2, which is the output of the inverter INV1, is equal to a voltage deviated from the threshold voltage of the inverter INV1 by (ΔV*A0+Vdiff)*A1 to the side opposite to the node voltage NET1.

Here, the potential difference between the node voltages NET2 and NET3 is maintained with the electric charge in the capacitor C1, and thus the node voltage NET3 is a voltage deviated from the voltage during presetting by (ΔV*A0+Vdiff)*A1+Vos1−(Vth_preset−Vth_ideal).

The node voltage NET3 is a voltage deviated from the threshold voltage of the inverter INV2 by ΔV*A0*A1. Thus, the node voltage NET4, which is the output of the inverter INV2, is equal to a voltage deviated from the threshold voltage of the inverter INV2 by ΔV*A0*A1*A2 to the side opposite to the node voltage NET3.

In the example in FIG. 6, when the threshold voltage of the inverter INV3 with the infinite gain is, for example, Vth_ideal, the node voltage NET4 is lower than Vth_ideal, and thus the comparison judgment output CMPOUT, which is the output of the inverter INV3, is High.

From then on, presetting operation and comparison operation are repeated alternately. In this way, in the comparator 1Y according to the second comparative example, it is possible to set the node voltages NET1, NET2, and NET4, which are the outputs of the inverters, near Vth_ideal by presetting, and this helps suppress a delay in the response of the outputs of the inverters in comparison operation.

With the comparator 1Y according to the second comparative example, as described above, the node voltage NET2 (voltage at the first terminal of the capacitor C1) during sampling is equal to Vth_ideal+Vdiff*A1+Vos1. However, when Vdiff, which is the difference between the threshold value of the inverter INV1 and that of the inverter INV0, is large, the node voltage NET2 may be fixed to the supply voltage VCC. In this case, if the node voltage NET2 is fixed to the supply voltage VCC during comparison operation, the node voltage NET3 that appears at the second terminal of the capacitor C1 is equal to the threshold voltage of the inverter INV2 during comparison operation, with no change from the one during sampling, and this may lead to the comparison judgment output CMPOUT being indefinite. In the example in FIG. 6, when Vdiff is large, the node voltage NET2 may be fixed to the supply voltage VCC during sampling.

Likewise, when Vdiff is large, the node voltage NET2 may be fixed to a ground potential during sampling. In this case, if the node voltage NET2 is fixed to the ground potential during comparison operation, the node voltage NET3 is not variable, which may also lead to the comparison judgment output CMPOUT being indefinite.

Comparator According to an Exemplary Embodiment of the Present Invention

Next, a description will be given of a comparator according to an exemplary embodiment of the present invention. This embodiment is an improved version of the second comparative example described above, devised to solve the above problem.

Figure 7:
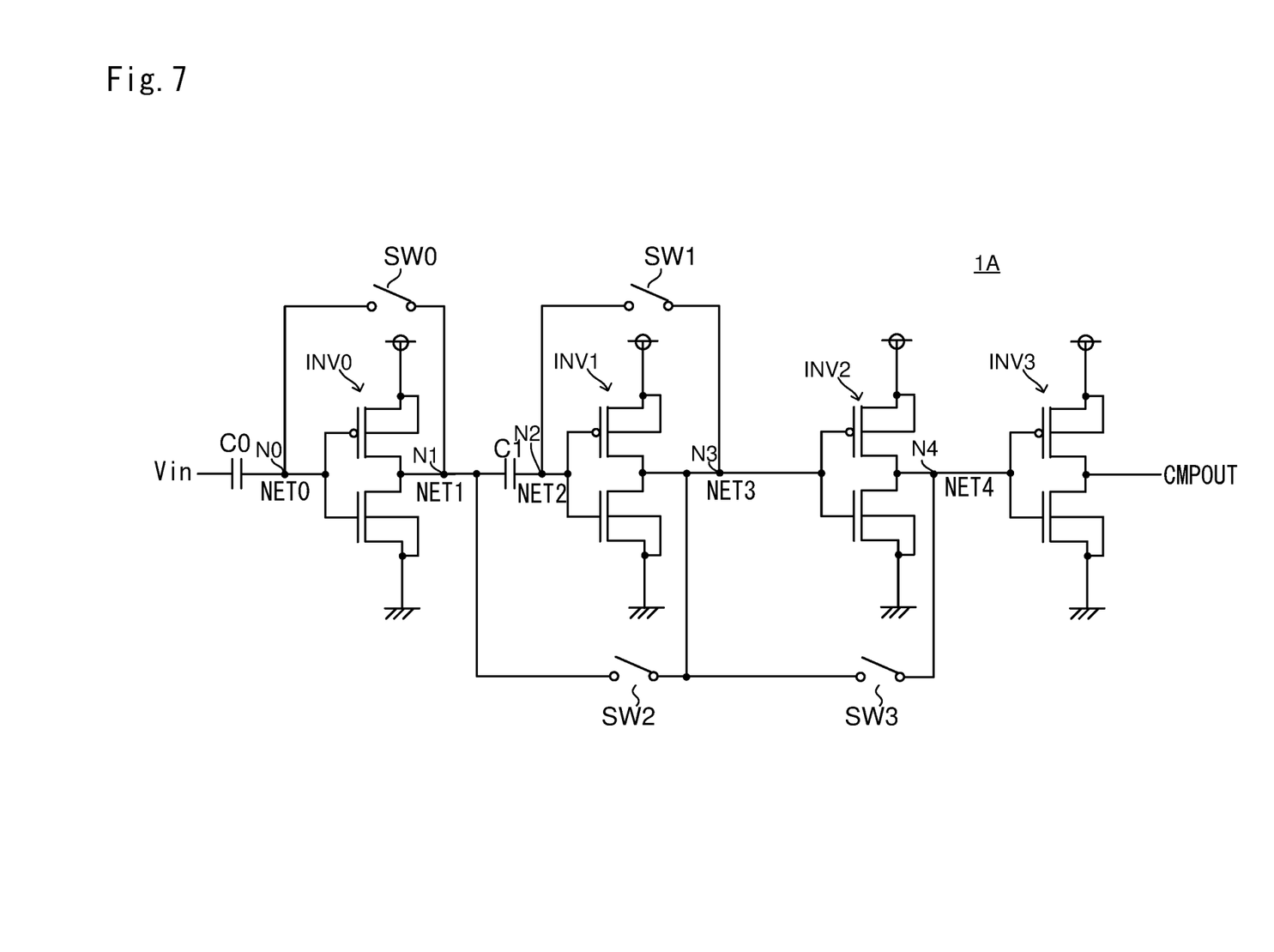
FIG. 7 is a diagram showing a configuration of a comparator according to one embodiment of the present invention.

FIG. 7 is a diagram showing a configuration of a comparator 1A according to the embodiment. The comparator 1A has a presetting function similar to that in the second comparative example. As shown in FIG. 7, the comparator 1A includes inverters INV0 to INV3, capacitors C0 and C1, and switches SW0 to SW3.

The first terminal of the capacitor C0 is fed with the input voltage Vin. The second terminal of the capacitor C0 and the input terminal of the inverter INV0 are connected together at a node N0. The output terminal of the inverter INV0 and the input terminal of the capacitor C1 are connected together at a node N1. The second terminal of the capacitor C1 and the input terminal of the inverter INV1 are connected together at a node N2. The output terminal of the inverter INV1 and the input terminal of the inverter INV2 are connected together at a node N3. The output terminal of the inverter INV2 and the input terminal of the inverter INV3 are connected together at a node N4.

The switch SW0 switches between conducting and cut-off states the path between the nodes N0 and N1. The switch SW1 switches between conducting and cut-off states the path between the nodes N2 and N3. The switch SW2 switches between conducting and cut-off states the path between the nodes N1 and N3. The switch SW3 switches between conducting and cut-off states the path between the nodes N3 and N4.

Figure 8:
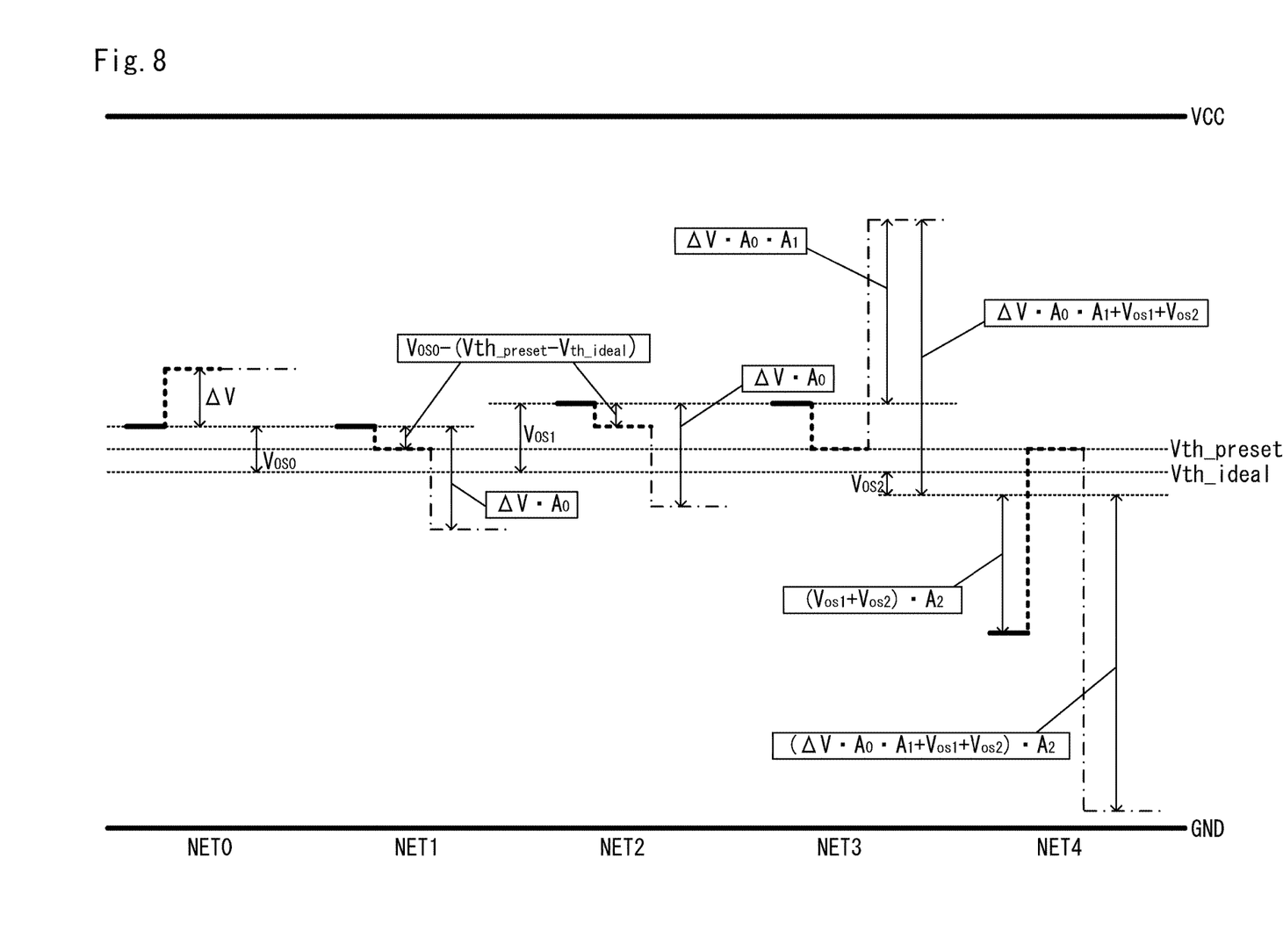
FIG. 8 is a diagram showing one example of the behavior of each node voltage in the comparator according to the embodiment of the present invention.

The operation of the comparator 1A so configured will be described with reference to FIG. 8. FIG. 8 shows the behavior of the node voltages NET0 to NET4 at the nodes N0 to N4 respectively. In FIG. 8, solid lines indicate sampling, broken lines indicate presetting, and dash-dot lines indicate comparison operation.

As shown in FIG. 5, it is assumed that the gains of the inverters INV0 to INV2 are A0 to A2 respectively and the offsets in the threshold voltage of the inverters INV0 to INV2 are Vos0 to Vos2 respectively.

First, with the switches SW0 and SW1 on and the switches SW2 and SW3 off, sampling is performed. Here, with the nodes N0 and N1 short-circuited together, the node voltages NET0 and NET1 are both equal to the threshold voltage of the inverter INV0. Here, in the example in FIG. 8, the threshold voltage of the inverter INV0 contains an offset Vos0 (FIG. 5) from the ideal threshold voltage Vth_ideal. With the nodes N2 and N3 short-circuited together, the node voltages NET2 and NET3 are both equal to the threshold voltage of the inverter INV1. Here, in the example in FIG. 8, the threshold voltage of the inverter INV1 contains an offset Vos1 (FIG. 5) from the ideal threshold voltage Vth_ideal.

Here, the node voltage NET4, which is the output of the inverter INV2, is equal to a voltage deviated from the threshold voltage of the inverter INV2 by (Vos1+Vos2)*A2 to the side opposite to the node voltage NET3. Here, in the example in FIG. 8, the threshold voltage of the inverter INV2 contains an offset Vos2 (FIG. 5) from the ideal threshold voltage Vth_ideal.

During sampling, the input signal IN is fed to the first terminal of the capacitor C0 as the input voltage Vin and, in accordance with the potential difference between the input voltage Vin and the node voltage NET0, electric charge is stored in the capacitor C0.

Next, with the switches SW0 and SW1 off and the switches SW2 and SW3 on, presetting is performed. Here, with the nodes N1, N3, and N4 short-circuited together, the node voltages NET1, NET3, and NET4 are all equal, at the preset voltage Vth_preset, which is the stabilization point.

The node voltage NET1 changes from the voltage during sampling by Vos0−(Vth_preset−Vth_ideal). In the capacitor C1, electric charge in accordance with the potential difference between the node voltages NET1 and NET2 during sampling is maintained; thus, during presetting, the node voltage NET2 is equal to a voltage changed from the threshold voltage of the inverter INV1 by Vos0−(Vth_preset−Vth_ideal).

During presetting, the analog data (DAC output voltage) output from the DAC5 is fed as the input voltage Vin to the first terminal of the capacitor C0. The potential difference at the capacitor C0 is maintained with the electric charge in the capacitor C0, and thus a voltage change ΔV occurs in the node voltage NET0 as large as the difference between the input signal IN and the analog data. FIG. 8 shows an example of the voltage change ΔV when the analog data is higher than the input signal IN.

Next, with the switches SW0 to SW3 all off, comparison operation is performed. Here, the node voltage NET1, which is the output of the inverter INV0, is equal to a voltage deviated from the threshold voltage of the inverter INV0 by ΔV*A0 in the direction opposite to the direction in which ΔV changes. The electric charge stored in the capacitor C1 is maintained, and thus the node voltage NET2 is a voltage deviated from the threshold voltage of the inverter INV1 by ΔV*A0.

The node voltage NET3, which is the output of the inverter INV1, is equal to a voltage deviated from the threshold voltage of the inverter INV1 by ΔV*A0*A1 to the side opposite to the node voltage NET2. The node voltage NET4, which is the output of the inverter INV2, is equal to a voltage deviated from the threshold voltage of the inverter INV2 by (ΔV*A0*A1+Vos1+Vos2)*A2 to the side opposite to the node voltage NET3.

In the example in FIG. 8, when the threshold voltage of the inverter INV3 with the infinite gain is, for example, Vth_ideal, the node voltage NET4 is lower than Vth_ideal, and thus the comparison judgment output CMPOUT, which is the output of the inverter INV3, is High.

From then on, presetting operation and comparison operation are repeated alternately. In this way, in the comparator 1A according to this embodiment, by presetting, it is possible to set the node voltages NET1, NET3, and NET4, which are the outputs of the inverters, near Vth_ideal, and this helps suppress a delay in the response of the outputs of the inverters in comparison operation.

Furthermore, with this embodiment, the node voltage NET1, which is the voltage at the first terminal of the capacitor C1, is always equal to the threshold voltage of the inverter INV0 during sampling. This helps prevent the node voltage NET1 from being fixed to the supply voltage VCC or the ground potential. Thus, during comparison operation, the node voltage NET2, which is the voltage at the second terminal of the capacitor C1, is variable, and this helps prevent the comparison judgment output CMPOUT from becoming indefinite.

Offset of the Comparator

The offset of the comparator 1A shown in FIG. 7 is calculated as follows.

The change ΔVNET4 in the node voltage NET4 with respect to the voltage change ΔV is given by formula (1) below.

$$\Delta VNET4 = (\Delta V*A0*A1+Vos1+Vos2)*A2 = \Delta V*A0*A1*A2+(Vos1+Vos2)*A2 \quad (1)$$

Dividing both sides of formula (1) by A0*A1*A2 gives $$\Delta VNET4/(A0*A1*A2) = \Delta V+Vos\_comp \quad (2)$$

Here, (Vos1+Vos2)*A2/(A0*A1*A2)=(Vos1+Vos2)/(A0*A1). Thus,

Vos_comp, which is the offset of the comparator in formula (2) is given by:

$$Vos\_comp = (Vos1+Vos2)/(A0*A1) \quad (3)$$

To reduce an offset as one of the characteristics of an ADC, it is necessary to reduce the offset of the comparator.

Effects of NBTI

Figure 9:
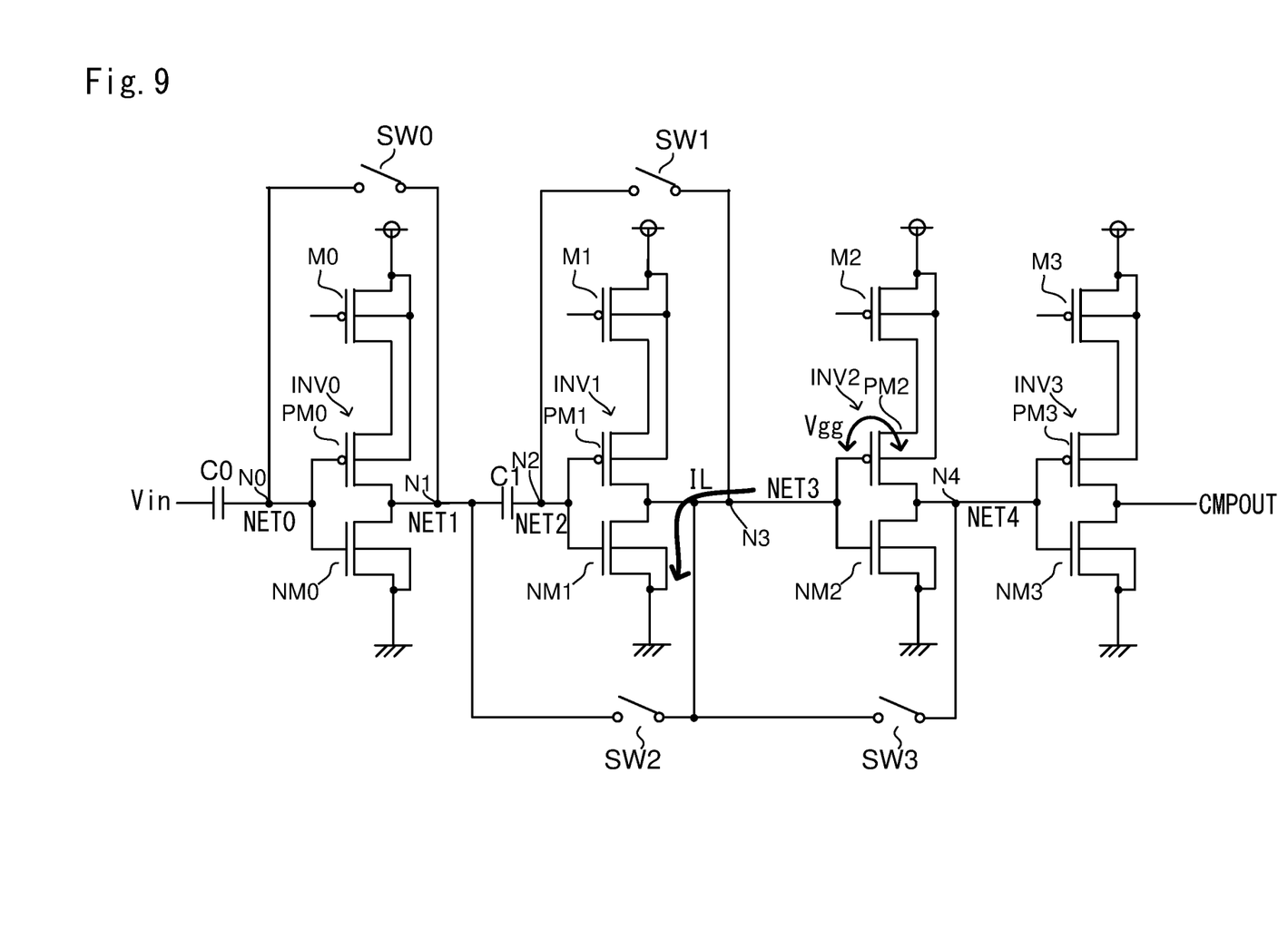
FIG. 9 is a diagram showing a configuration of a comparator according to one embodiment of the present invention.

FIG. 9 shows a configuration resulting from adding a configuration to switch on and off the supply voltage to each inverter to the configuration of the comparator 1A shown in FIG. 7. Specifically, in FIG. 9, PMOS transistors M0 to M3 have been added to the configuration of the comparator 1A. The sources of the PMOS transistors M0 to M3 are all connected to an application terminal for a supply voltage. The drains of the PMOS transistors M0 to M3 are connected to the sources of the PMOS transistors PM0 to PM3 in the inverters INV0 to INV3 respectively. The back gates of the PMOS transistors M0 to M3 and the back gates of the PMOS transistors PM0 to PM3 are all connected to the application terminal for the supply voltage respectively.

By turning on and off the PMOS transistors M0 to M3, it is possible to switch on and off the supply voltage to the inverters INV0 to INV3. The PMOS transistors M0 to M3 act as power supply switches that switch between conducting and cut-off states the paths between the application terminal for the supply voltage and the sources of the PMOS transistors PM0 to PM3.

Here, when, with power down, the PMOS transistors M0 to M3 are off, for example, a leakage current IL may pass through the off-state NMOS transistor NM1 in the inverter INV1 to keep the node voltage NET3 equal to the ground potential. In this case, a negative bias Vgg is applied between the gate and the back gate of the PMOS transistor PM2 in the inverter INV2 and this leaves the PMOS transistor PM2 prone to deterioration due to NBTI (negative bias temperature instability). Thus, the threshold voltage of the PMOS transistor PM2 shifts to change the value of the offset Vos2 of the threshold voltage of the inverter INV2 in formula (3) above, and this may increase the offset Vos_comp of the comparator.

Also when the node N3 is pulled down with a resistor R1, a MOS transistor, etc., the node voltage NET3 may remain equal to the ground potential with power down so that a negative bias Vgg is applied between the gate and back gate of the PMOS transistor PM2, and this may cause a phenomenon similar to what has been described above.

Measures Against NBTI

Figure 10:
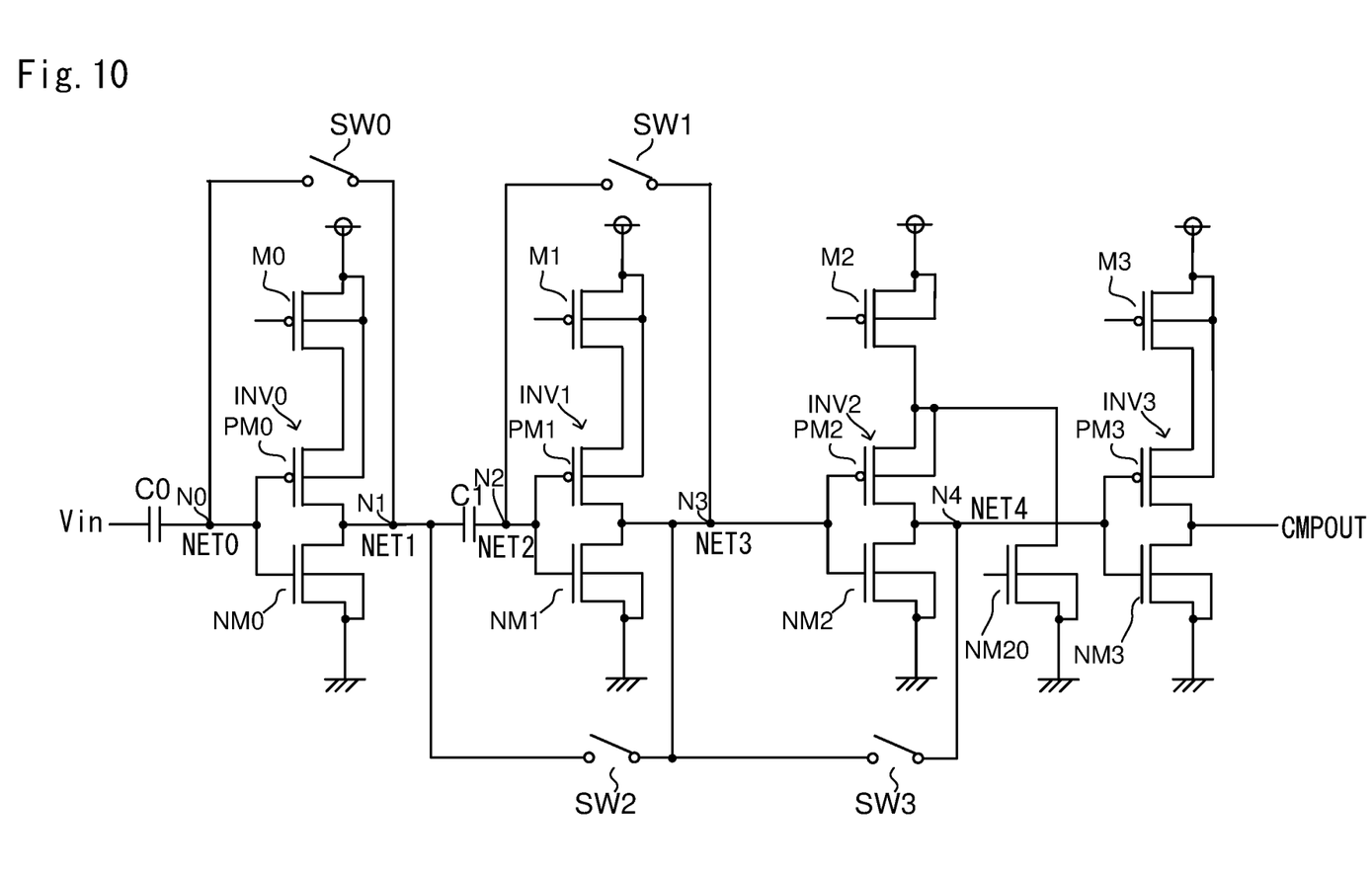
FIG. 10 is a diagram showing a configuration of a comparator according to a modified example of the present invention.

As a solution, the configuration of a comparator like the one shown in FIG. 10 may be adopted. Specifically, in the configuration shown in FIG. 10, the back gate of the PMOS transistor PM2 in the inverter INV2 is connected to the source of the PMOS transistor PM2 so that the supply voltage is not applied to it, and to that back gate, the drain of the NMOS transistor NM20 is connected. The source of the NMOS transistor NM20 is connected to an application terminal for the ground potential. That is, the NMOS transistor NM20 serves as a switch that switches between conducting and cut-off states the path between the back gate mentioned above and the application terminal for the ground potential described above.

Thus, when, with the PMOS transistors M0 to M3 on, the supply voltage is fed to the inverter INV2, the NMOS transistor NM20 is off. When, with power down, the PMOS transistors M0 to M3 are off, the NMOS transistor NM20 is on. Thus, even if, with power down, the node voltage NET3 is equal to the ground potential, the ground potential is applied to the back gate of the PMOS transistor PM2, and thus it is possible to prevent a negative bias from being applied between the gate and the back gate of the PMOS transistor PM2. Thus, it is possible to prevent deterioration of the PMOS transistor PM2 due to NBTI.

Figure 11:
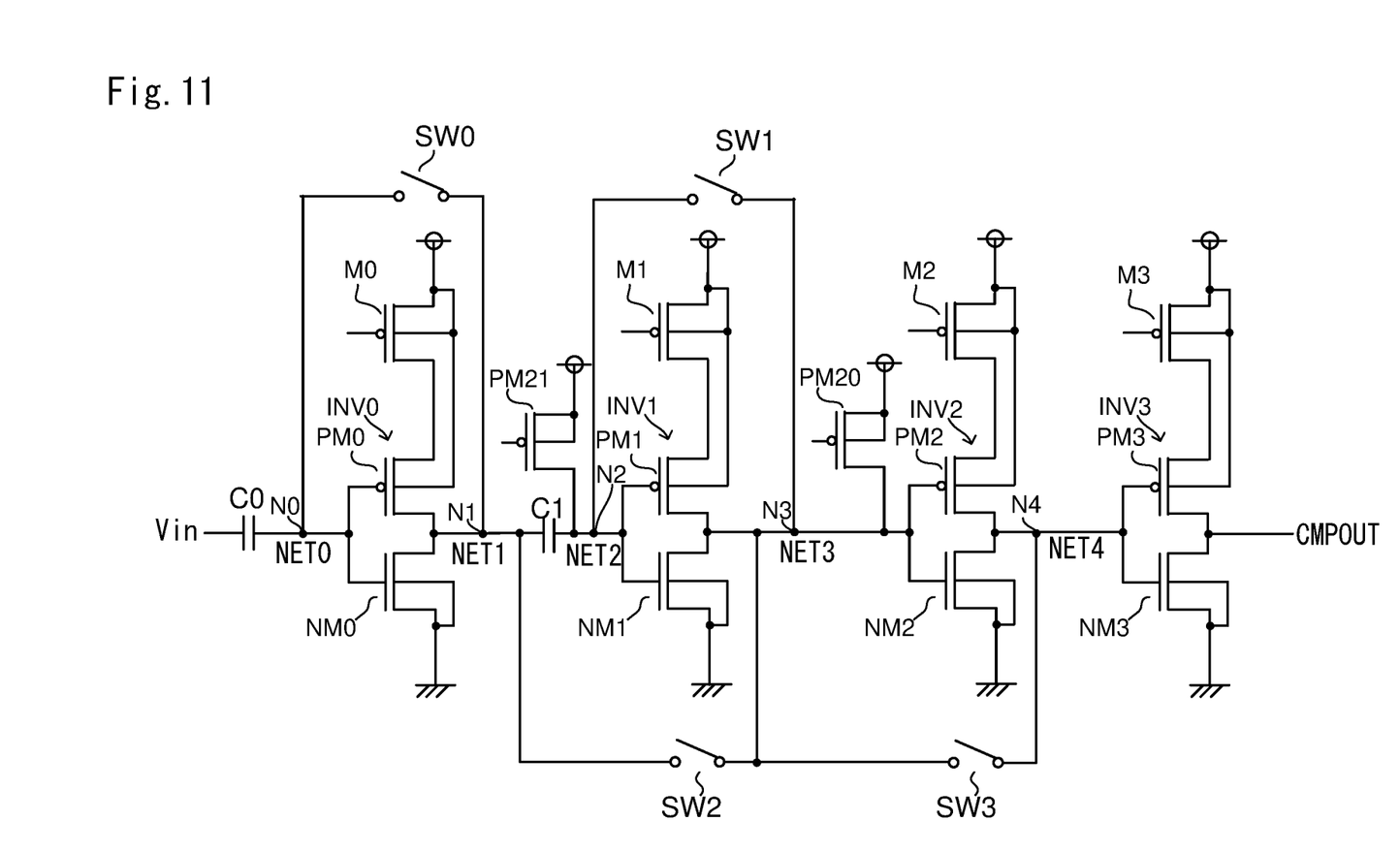
FIG. 11 is a diagram showing a configuration of a comparator according to another modified example of the present invention.

It is also possible to adopt the configuration shown in FIG. 11. In the configuration shown in FIG. 11, the supply voltage is applied to the back gate of the PMOS transistor PM2, and the node N3 is pulled up with the PMOS transistor PM20. Thus, when, with power down, the PMOS transistors M0 to M3 are off, the supply voltage is applied to the back gate of the PMOS transistor PM2, but, with the PMOS transistor PM20 on, the node voltage NET3 remains equal to the supply voltage, and this helps prevent a negative bias from being applied between the gate and back gate of the PMOS transistor PM2. With the comparator operating, the PMOS transistor PM20 is off. Here, in the configuration in FIG. 11, with power down, a positive bias is applied between the gate and the back gate of the NMOS transistor NM2, and this may cause deterioration of the NMOS transistor NM2 due to PBTI (positive bias temperature instability). Thus, the configuration shown in FIG. 10 is preferable to the one shown in FIG. 11.

To reduce the offset of the comparator, it is also preferable to reduce the offset Vos1 in the inverter INV1. Thus, it is possible to provide a MOS transistor, like the MOS transistor NM20 described above, that feeds the ground potential to the back gate of the PMOS transistor PM1 in the inverter INV1. Or, as shown in FIG. 11, the node N2 can be pulled up with the PMOS transistor PM21.

Others

The embodiments of the present invention described above allow for many modifications made without departing from the spirit of the present invention.

INDUSTRIAL APPLICABILITY

The present invention finds applications in, for example, ADCs.

LIST OF REFERENCE SIGNS

10 ADC (AD converter)
1 comparator
2 comparison latch
3 data latch
4 DAC data generator
5 DAC (DA converter)
6 switch
7 switch
1X, 1Y, 1A comparator
INV0 to INV3 inverter
C0, C1 capacitor
SW0, SW3 switch
N0 to N4 node
M0 to M3 PMOS transistor
PM0 to PM3 PMOS transistor
NM0 to NM3 NMOS transistor

The invention claimed is:
1. A comparator circuit comprising:
a zeroth capacitor configured to have a first terminal to which an input voltage is applied;
a zeroth inverter configured to have an input terminal connected to a second terminal of the zeroth capacitor at a zeroth node;
a first capacitor configured to have a first terminal connected to an output terminal of the zeroth inverter at a first node;
a first inverter configured to have an input terminal connected to a second terminal of the first capacitor at a second node;
a second inverter configured to have an input terminal connected to an output terminal of the first inverter at a third node;
a zeroth switch configured to switch between conducting and cut-off states a path between the zeroth and first nodes;
a first switch configured to switch between conducting and cut-off states the path between the second and third nodes;
a second switch configured to switch between conducting and cut-off states the path between the first and third nodes; and a third switch configured to switch between conducting and cut-off states the path between the third node and an output terminal of the second inverter.

2. The comparator circuit according to claim 1, further comprising a third inverter configured to have an input terminal connected to the output terminal of the second inverter at a fourth node.

3. The comparator circuit according to claim 1, wherein
the zeroth to second inverters are configured to each include
a PMOS transistor configured to have a source to which a supply voltage is applied and
an NMOS transistor configured to have a drain connected to a drain of the PMOS transistor and a source to which a ground potential is applied, and
a gate of the PMOS transistor and a gate of the NMOS transistor are configured to be short-circuited together.

4. The comparator circuit according to claim 3, further comprising a power supply switch configured to switch between conducting and cut-off states a path between an application terminal for the supply voltage and the source of the PMOS transistor.

5. The comparator circuit according to claim 4, wherein, with the power supply switch off, an equal potential is applied to the gate and a back gate of the PMOS transistor included in at least one of the first and second inverters.

6. The comparator circuit according to claim 5, further comprising a switch configured to switch between conducting and cut-off states a path between the back gate and an application terminal for the ground potential.

7. The comparator circuit according to claim 5, wherein at least one of the third and second nodes is pulled up with the PMOS transistor.

8. An AD converter comprising:
the comparator circuit according to claim 1;
a DAC data generator configured to generate DAC data, which is digital data;
a DAC (DA converter); and
an output signal generator,
wherein
the comparator circuit is configured to sample an input signal, which is an analog signal, and compare the sampled input signal with analog data that results from the DAC converting the DAC data,
the DAC data generator is configured to update the DAC data in accordance with a result of comparison by the comparator circuit, and
the output signal generator is configured to determine bit data of an output signal in accordance with the result of comparison by the comparison result.

* * * * *